United States Patent
Kawamoto et al.

(10) Patent No.: US 7,106,397 B1
(45) Date of Patent: Sep. 12, 2006

(54) LIQUID CRYSTAL DISPLAY DEVICE HAVING A POLARIZATION MEMBER THAT INCLUDES A CHOLESTERIC LIQUID CRYSTAL LAYER AND SOLID OPTICAL ROTATORY FILM

(75) Inventors: Ikuo Kawamoto, Osaka (JP); Tadayuki Kameyama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/031,871

(22) PCT Filed: Aug. 4, 2000

(86) PCT No.: PCT/JP00/05255

§ 371 (c)(1),
(2), (4) Date: Jan. 24, 2002

(87) PCT Pub. No.: WO01/11399

PCT Pub. Date: Feb. 15, 2001

(30) Foreign Application Priority Data

Aug. 4, 1999 (JP) .................................. 11-221389

(51) Int. Cl.
*G02F 1/1335* (2006.01)
(52) U.S. Cl. ........................... 349/96; 348/98; 348/117
(58) Field of Classification Search ................. 349/96, 349/98, 117
See application file for complete search history.

(56) References Cited

U.S. PATENT DOCUMENTS

| | | | | |
|---|---|---|---|---|
| 3,652,956 A | * | 3/1972 | Pinnow et al. ............... | 359/278 |
| 4,032,218 A | * | 6/1977 | Scheffer ...................... | 349/115 |
| 5,627,666 A | * | 5/1997 | Sharp et al. ................. | 349/74 |
| 6,160,595 A | * | 12/2000 | Kishimoto ................... | 349/61 |

FOREIGN PATENT DOCUMENTS

| | | |
|---|---|---|
| EP | 457607 A | 11/1991 |
| EP | 0 881 510 A | 12/1998 |
| JP | 6-75114 A | 3/1994 |
| JP | 6-75214 A | 3/1994 |
| JP | 6-75221 A | 3/1994 |

(Continued)

OTHER PUBLICATIONS

"Large Aperture Polarized Light Source and Novel Liquid Crystal Display Operating Modes", Japanese Journal of Applied Physics, Publication Office Japanese Journal of Applied Physics, Tokyo, Japan, vol. 29, No. 4, part 2, Apr. 1, 1990; Belayev, et al.

*Primary Examiner*—Tarifur R. Chowdhury
(74) *Attorney, Agent, or Firm*—Sughrue Mion, PLLC

(57) ABSTRACT

The present invention provides a polarizing member constituted by, at least, a cholesteric liquid-crystal layer (1), a quarter-wave plate (2), and an optical rotatory layer (3). By the polarizing member according to the present invention, the plane of polarization of light linearly polarized by a combination of the cholesteric liquid-crystal layer and the quarter-wave plate are rotated by the optical rotatory layer so that the linearly polarized light is supplied to an absorption type polarizer (4) with good coincidence between the plane of polarization of the linearly polarized light and the axis of polarization of the absorption type polarizer. Thus, there can be obtained a liquid-crystal display device which has luminance improved by prevention of absorption loss and is excellent in display quality. That is, in a liquid-crystal display device improved in luminance by use of a cholesteric liquid-crystal layer, coloring can be suppressed evenly in all obliquely viewing azimuths while good viewing characteristic can be achieved in a frontal direction.

5 Claims, 1 Drawing Sheet

FOREIGN PATENT DOCUMENTS

| | | |
|---|---|---|
| JP | 8-271731 A | 10/1996 |
| JP | 9-329779 A | 12/1997 |
| JP | 10-197722 A | 7/1998 |

* cited by examiner

LIQUID CRYSTAL DISPLAY DEVICE HAVING A POLARIZATION MEMBER THAT INCLUDES A CHOLESTERIC LIQUID CRYSTAL LAYER AND SOLID OPTICAL ROTATORY FILM

TECHNICAL FIELD

The present invention relates to a polarizing member which can suppress coloring in an obliquely viewing direction in a liquid-crystal display device improved in luminance by use of a cholesteric liquid-crystal layer.

BACKGROUND ART

Heretofore known is a liquid-crystal display device in which light made to exit from a backlight is linearly polarized by a combination of a cholesteric liquid-crystal layer and a quarter-wave plate so that the linearly polarized light is supplied to an absorption type polarizer with little absorption loss or the like to attain improvement of luminance to make it possible to achieve reduction in thickness of the liquid-crystal display device and increase in size thereof advantageously. In such a device, generally, the axial relation between the plane of polarization of light linearly polarized by the cholesteric liquid-crystal layer or the like and the axis of polarization of the absorption type polarizer is adjusted so that good viewing characteristic can be obtained in a frontal (perpendicular) direction which forms a main viewing point. The plane of polarization of the linearly polarized light and the axis of polarization of the absorption type polarizer are usually arranged at a crossing angle of about 45 degrees.

Hence, the optical axis was displaced in an obliquely viewing direction shifted from the frontal direction. There was a problem that display was colored on the basis of the displacement of the optical axis. Although there might be proposed a system in which the coloring problem is suppressed by controlling retardation in a direction of the thickness of the display device or by controlling the wavelength range by used of the cholesteric liquid-crystal layer, it was difficult to suppress coloring evenly in all obliquely viewing azimuths and there was a disadvantage that coloring was apt to remain particularly in the direction of the axis of the polarizer.

An object of the present invention is to provide a polarizing member which can suppress coloring evenly in all obliquely viewing azimuths while achieving good viewing characteristic in a frontal direction in a liquid-crystal display device improved in luminance by use of a cholesteric liquid-crystal layer.

DISCLOSURE OF THE INVENTION

The present invention provides a polarizing member constituted, at least, by a cholesteric liquid-crystal layer, a quarter-wave plate, and an optical rotatory layer.

BEST MODE FOR CARRYING OUT THE INVENTION

Figure 1:
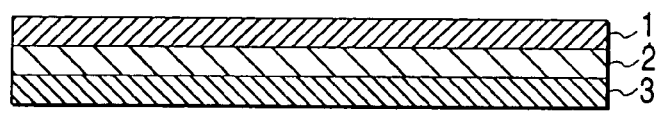
FIG. 1 is a sectional view showing an example of a polarizing member.
Figure 2:
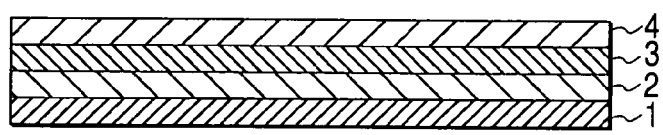
FIG. 2 is a sectional view showing another example of the polarizing member.

As shown in FIG. 1, a polarizing member according to the present invention is constituted, at least, by a cholesteric liquid-crystal layer 1, a quarter-wave plate 2, and an optical rotatory layer 3. As shown in FIG. 2, the polarizing member may be additionally constituted by an absorption type polarizer 4.

As the cholesteric liquid-crystal layer, it is possible to use any suitable one that can separate incident natural light into reflected light of circularly polarized light and transmitted light of circularly polarized light to thereby obtain transmitted light constituted by one of left and right circularly polarized light components. The cholesteric liquid-crystal layer is not particularly limited in kind. Examples of the cholesteric liquid-crystal layer include: an alignment film of a cholesteric liquid-crystal polymer; an aligned liquid-crystal layer of the cholesteric liquid-crystal polymer supported on a film base material; and so on.

Hence, in accordance with the cholesteric liquid-crystal layer, light emitted from a light source such as a backlight or the like can be made incident on the cholesteric liquid-crystal layer to thereby obtain transmitted circularly polarized light. Moreover, reflected circularly polarized light can be reflected/inverted through a reflection layer or the like so as to be made incident on the cholesteric liquid-crystal layer again. Hence, part or all of the light can be transmitted as circularly polarized light in a predetermined state to attain increase of the intensity of light transmitted through the cholesteric liquid-crystal layer to thereby attain improvement of luminance.

The cholesteric liquid-crystal layer may be provided as a structure in which two layers or three or more layers different in wavelength to be reflected are arranged in combination so as to be superposed on one another. In this case, reflected or/and transmitted circularly polarized light can be obtained in a wide wavelength range such as a visible light range or the like. Therefore, the cholesteric liquid-crystal layer used may be constituted by such a superposed body.

On the other hand, the quarter-wave plate is provided so that the light circularly polarized by the cholesteric liquid-crystal layer is linearly polarized into light incapable of being absorbed by the absorption type polarizer. Hence, the quarter-wave plate is combined with the cholesteric liquid-crystal layer to obtain linearly polarized light so that the linearly polarized light can be supplied to the absorption type polarizer with suppression of absorption loss. Hence, the intensity of light allowed to be used for liquid-crystal display or the like can be increased, and improvement of luminance can be attained.

Incidentally, a phase retarder functioning as the quarter-wave plate in a wide wavelength range such as a visible light range or the like can be obtained by a suitable system such as a system in which a retardation layer functioning as a quarter-wave plate for monochromatic light such as light with a wavelength of 550 nm is superposed on a retardation layer exhibiting another retardation characteristic, such as a retardation layer functioning as a half-wave plate for the monochromatic light. Therefore, the quarter-wave plate disposed on the cholesteric liquid-crystal layer may be constituted by one retardation layer or by a combination of two or more retardation layers.

The optical rotatory layer is provided for controlling the plane of polarization of linearly polarized light made to exit from the quarter-wave plate. Hence, as the optical rotatory layer, it is possible to use any suitable one capable of rotating the plane of polarization of linearly polarized light. The optical rotatory layer is not particularly limited in kind. Especially, an optical rotatory layer composed of a polymer containing a nematic liquid-crystal monomer and an optically active monomer as components can be preferably used from the point of view of reduction in thickness and weight, increase in area, homogeneity of optically rotating characteristic, and so on.

An example of the nematic liquid-crystal monomer is a monomer capable of forming a main chain type or side chain type liquid-crystal polymer having main or side chains into which conjugate linear atomic groups (mesogens) for giving liquid-crystal alignment characteristic are introduced. Incidentally, a specific example of the monomer is a monomer capable of forming a main chain type nematic liquid-crystal polymer, such as a polyester polymer, a polyamide polymer, a polycarbonate polymer or a polyester-imide polymer, having a structure in which such mesogen groups are bonded to each other by a spacer portion giving flexibility.

Another specific example of the monomer is a monomer capable of forming a side chain type nematic liquid-crystal polymer containing polysiloxane, polyacrylate, polymethacrylate or polymalonate as a main chain skeleton and containing, as side chains, mesogen portions made of para position-substituted cyclic compound units for giving nematic alignment characteristic through a spacer portion which is composed of a conjugate atomic group.

On the other hand, examples of the optically active monomer may include: a monomer having optically active carbon which can be introduced into the main chain of a main chain type liquid-crystal polymer of the aforementioned nematic liquid-crystal monomer by a copolymerization system or the like; a monomer having optically active carbon which can be introduced into the side chain of a side chain type liquid-crystal polymer of the aforementioned nematic liquid-crystal monomer, especially into a terminal of the side chain thereof; and so on.

The optical rotatory layer of the aforementioned polymer containing the nematic liquid-crystal monomer and the optically active monomer as components can be formed as follows. For example, a polymer is formed from these monomers by a suitable system such as a heating system or the like. Then, on an alignment film obtained by rubbing treatment, a solution of the polymer in a solvent or the like is developed as a thin layer by a suitable method such as a spin coating method, a roll coating method, a flow coating method, a printing method, a dip coating method, a cast film-forming method or the like. The thin film is heated to be aligned. The aligned polymer film obtained thus is peeled off from the alignment film. Thus, a polymer film is obtained. The thickness of the optical rotatory layer can be determined suitably on the basis of the degree of optical rotation, or the like, depending on the angle of twist in nematic alignment. The thickness of the optical rotatory layer is generally selected to be in a range of from 1 to 100 µm, particularly in a range of from 2 to 50 µm.

As described above, the optical rotatory layer is provided for rotating the plane of polarization of linearly polarized light made to exit from the quarter-wave plate. Therefore, in the polarizing member, the cholesteric liquid-crystal layer, the quarter-wave plate and the optical rotatory layer are arranged so that the quarter-wave plate 2 is interposed between the cholesteric liquid-crystal layer 1 and the optical rotatory layer 3 as shown in FIGS. 1 and 2.

As shown in FIG. 2, the polarizing member may additionally has an absorption type polarizer 4 provided on an upper side of the optical rotatory layer 3. In this case, the axial relations between the respective layers are preferably set from the point of view of suppressing coloring uniformly in all obliquely viewing azimuths so that the major or minor axis of the optical rotatory layer (that is, the major or minor axis of liquid crystal forming the optical rotatory layer) is made coincident (parallel) with the plane of polarization of linearly polarized light made to exit from the quarter-wave plate and with the axis of polarization of the absorption type polarizer as much as possible in each of the opposite surfaces (the quarter-wave plate side surface and the absorption type polarizer side surface) of the optical rotatory layer. That is, the axial relations are preferably set so that the major or minor axis of the optical rotatory layer is made coincident with the axis of polarization of the absorption type polarizer as much as possible after the plane of polarization of linearly polarized light made to exit from the quarter-wave plate is rotated by the optical rotatory layer.

The absorption type polarizer is preferably arranged so that the axis of polarization of the absorption type polarizer is adjusted relative to the plane of polarization of linearly polarized light made to exit from the quarter-wave plate in order to make frontal viewing characteristic good in the case where a liquid-crystal display device is formed. The crossing angle between the plane of polarization and the axis of polarization in this arrangement is usually about 45 degrees.

Therefore, the optical rotatory layer preferably used from the point of view of obtaining a liquid-crystal display device having excellent display quality in which coloring is suppressed uniformly in all obliquely viewing azimuths while good viewing characteristic is achieved in the frontal direction exhibits an angle of rotation satisfying the expression:

$$(2n+1)\pi/4$$

in which $\underline{n}$ is an integer.

The angle of rotation can be controlled on the basis of the kind of the material for forming the optical rotatory layer, the thickness of the optical rotatory layer, and so on.

Incidentally, when the absorption type polarizer is provided in the polarizing member, any other polarizer provided on the back side (opposite to the visual side) of the liquid-crystal cell can be omitted. Further, when an absorption type polarizer is provided separately on the back side of the liquid-crystal cell without provision of any absorption type polarizer in the polarizing member, it is also preferable that the aforementioned axial relations and the angle of rotation are satisfied.

As the absorption type polarizer, it is possible to use a suitable one capable of transmitting linearly polarized light with a predetermined axis of polarization while absorbing the other light. The absorption type polarizer is not particularly limited in kind. Examples of the material of the absorption type polarizer include: a polarizing film obtained by drawing a hydrophilic high-molecular film such as a polyvinyl alcohol film, a partially formalized polyvinyl alcohol film or a partially saponified ethylene-vinyl acetate copolymer film after absorbing iodine and/or dichromatic dye to the hydrophilic high-molecular film; a polyene-oriented polarizing film such as a polyvinyl alcohol dehydrate film or a vinyl chloride dehydrochlorinate film; and so on.

The absorption type polarizer may be constituted by the aforementioned polarizing film provided with a transparent protective layer disposed on one of opposite surfaces of the polarizing film or with transparent protective layers disposed on the opposite surfaces of the polarizing film. Such a transparent protective layer is provided for the purpose of protection such as improvement of water resistance, reinforcement, or the like. A polymer excellent in transparency, mechanical strength, heat stability, moisture sealability, and so on, is preferably used for forming the transparent protective layer. Examples of the polymer may include: a polyester polymer such as polyethylene terephthalate or polyethylene naphthalate; a cellulose polymer such as cellulose diacetate or cellulose triacetate; a polycarbonate polymer; an acrylic polymer such as polymethyl methacrylate; and a styrene polymer such as polystyrene or acrylonitrile-styrene copolymer.

Examples of the polymer may further include: an olefin polymer such as polyethylene, polypropylene, polyolefin of a cyclo type or norbornene structure or ethylene-propylene copolymer; a vinyl chloride polymer; an amide polymer such as Nylon or aromatic polyamide; an imide polymer; a sulfone polymer; a polyether-sulfone polymer; a polyether-ether-ketone polymer; a polyphenylene sulfide polymer; a vinyl alcohol polymer; a vinylidene chloride polymer; a vinyl butyral polymer; an allylate polymer; a polyoxymethylene polymer; an epoxy polymer; a blend of these polymers; and so on.

The respective layers constituting the polarizing member may be made to adhere to one another through adhesive layers as occasion demands. Each of the adhesive layers can be formed from a suitable adhesive agent such as a tacky material, a tackiness agent, a hot-melt adhesive agent, or the like, containing, as a base polymer, a suitable polymer such as acrylic polymer, silicone polymer, polyester, polyurethane, polyether, synthetic rubber, or the like. Particularly, a material such as an acrylic tackiness agent excellent in optical transparency, weather resistance, heat resistance, and so on, is preferably used because a peel problem in floating, stripping, etc. does not occur under a heating and moistening condition.

A specific example of the acrylic tackiness agent is a tackiness agent which contains an acrylic polymer 100,000 or higher in weight-average molecular weight as a base polymer and which is formed by copolymerizing (meth) acrylic alkylester containing an alkyl group such as a methyl group, an ethyl group, a butyl group, or the like, having 20 or less carbon atoms; and an acrylic monomer made of an improved component of (meth)acrylic acid, hydroxyethyl (meth)acrylate, or the like; in combination to obtain a glass transition temperature of not higher than 0° C. The acrylic tackiness agent used is not limited to the specific example.

The provision of the adhesive or tacky layer onto the cholesteric liquid-crystal layer, the quarter-wave plate, the optical rotatory layer, the absorption type polarizer or the like can be performed by a suitable system such as a system of attaching an adhesive agent or tackiness agent solution directly onto the quarter-wave plate or the like by a suitable developing system such as casting, coating or the like, or a system of forming a tacky layer on a separator and transferring the tacky layer onto the quarter-wave plate or the like in accordance with the above description.

The thickness of the adhesive layer can be determined suitably in accordance with adhesive force or the like and is generally selected to be in a range of from 1 to 500 μm. The adhesive layer may be provided on the outer surface of the polarizing member in accordance with the necessity of bonding the polarizing member to another member such as a liquid-crystal cell. Further, transparent fine particles may be mixed with the adhesive layer in accordance with the necessity so as to form the adhesive layer as a light-diffusing type adhesive layer. Incidentally, when the adhesive layer is constituted by a tacky layer having its surface exposed to the outside, the surface of the adhesive layer is preferably temporarily covered with a separator before practical use for the purpose of protection such as anti-contamination or the like.

Figure 3:
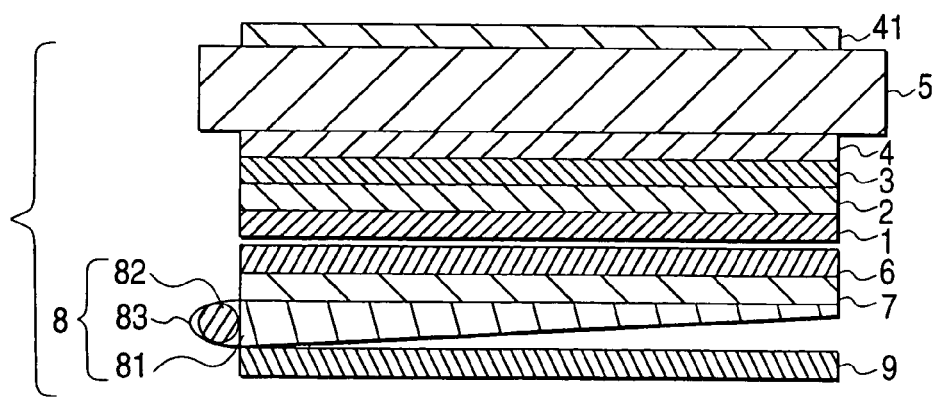
FIG. 3 is a sectional view showing an example of a liquid-crystal display device.

The polarizing member according to the present invention can be used for various purposes in accordance with the background art such as improvement of luminance of a liquid-crystal display device or the like. As shown in FIG. 3, the liquid-crystal display device can be formed by arranging the polarizing member on the back side (opposite to the visual side) of a liquid-crystal cell 5, that is, on the side where a planar light source 8 is provided. Incidentally, the device shown in FIG. 3 is formed by placing the liquid-crystal cell 5 on the planar light source (backlight) 8 through a light-diffusing sheet 7 and a light-condensing sheet 6. An absorption type polarizer 41 is bonded to the visual side of the liquid-crystal cell 5. The optical rotatory layer 3 of the polarizing member is bonded to the back side (opposite to the visual side) of the liquid-crystal cell 5 through the absorption type polarizer 4.

The planar light source 8 is a side backlight in which a reflection layer 9 is provided on the bottom surface of a light guide plate 81 while a light source 82 enclosed by a holder 83 is disposed on a side surface of the light guide plate 81. The light-condensing sheet 6 above the planar light source 8 is constituted by a prism sheet. Further, the visual side absorption type polarizer 41 is provided with an anti-glare layer disposed on the outer surface of the absorption type polarizer 41.

According to the aforementioned liquid-crystal display device, light emitted from the planar light source 8 is diffused by the light-diffusing sheet 7 and the optical path of the light is controlled by the light-condensing sheet 6, so that the light is made incident on the cholesteric liquid-crystal layer 1. The light is separated into reflected light and transmitted light by the cholesteric liquid-crystal layer 1. The transmitted circularly polarized light is linearly polarized by the quarter-wave plate 2, so that the linearly polarized light is made incident on the optical rotatory layer 3.

The plane of polarization of the linearly polarized light incident on the optical rotatory layer 3 is rotated by the optical rotatory layer 3, so that the light is made incident on the absorption type polarizer 4 and transmitted through the absorption type polarizer 4 in the condition that the light can be hardly absorbed by the absorption type polarizer 4. The transmitted light enters the liquid-crystal cell 5, so that display light is made to exit from the liquid-crystal cell 5 through the visual side absorption type polarizer 41. On this occasion, improvement of luminance is achieved because absorption loss owing to the absorption type polarizer 4 is small and because light reflected by the cholesteric liquid-crystal layer 1 is inverted by the reflection layer 9 on the lower surface side of the light guide plate and made incident on the cholesteric liquid-crystal layer 1 again to be transmitted through the cholesteric liquid-crystal layer 1 so that light-utilizing efficiency can be improved by use of the reflected light.

In practical use of the polarizing member, one kind or two or more kinds of suitable optical layers may be incorporated in the polarizing member for improvement of efficiency in assembling the liquid-crystal display device, or the like. The absorption type polarizer provided on the back side (opposite to the visual side) as described above is an example of the optical layer. Further, a phase retarder or the like may be provided in accordance with the necessity of compensating for the retardation caused by the liquid-crystal cell in order to improve viewing characteristic.

The optically compensating phase retarder may be provided on the light-transmission side of the absorption type polarizer 4, or the like. The phase retarder can be obtained as a suitable one in accordance with the background art. The suitable phase retarder can be formed in the similar manner to that in the quarter-wave plate or the like. That is, examples of the suitable phase retarder may include: a birefringent film constituted by a drawn film made of any kind of polymer; an aligned film of a liquid-crystal polymer such as a discotic polymer or a nematic polymer; a film obtained by supporting the aligned liquid-crystal layer on a film base material; and so on. In the case of a film obtained by supporting the aligned liquid-crystal layer on a film base material, a material such as a cellulose film excellent in isotropy is preferably used as the film base material.

Incidentally, the polymer for forming the birefringent film may be a suitable polymer as exemplified in the description of the polymer for forming the transparent protective layer. Particularly, a polymer such as a polyester polymer or a polyether-ether-ketone polymer excellent in crystallinity may be preferably used. The drawn film may be formed by a suitable method such as uniaxial drawing, biaxial drawing or the like. The birefringent film may be a film in which the refractive index in the direction of the thickness of the film is controlled by a system of giving shrinking force or/and stretching force under adhesion to a heat-shrinkable film. The optically compensating phase retarder may be constituted by a laminate of two or more retardation layers for the purpose of controlling optical characteristic such as retardation or the like.

As described above, when a liquid-crystal display device is formed, the polarizing member is disposed on the side of the liquid-crystal cell on which illumination light emitted from the planar light source or the like is made incident. The liquid-crystal display device can be formed in accordance with the background art without any specific limitation except that the polarizing member according to the present invention is used.

Hence, any suitable liquid-crystal cell can be used for forming the liquid-crystal display device. For example, suitable type liquid-crystal cells such as an active matrix drive type liquid-crystal cell represented by a thin-film transistor type liquid-crystal cell, a passive matrix drive type liquid-crystal cell represented by a TN type or STN type liquid-crystal cell, a liquid-crystal cell provided with a color filter, and soon, can be used for forming various liquid-crystal display devices.

In the liquid-crystal display device, one layer or two or more layers of suitable parts such as a light-condensing sheet constituted by a prism sheet or a lens sheet, a light-diffusing plate, a backlight, and so on, may be disposed in a suitable position or suitable positions. Incidentally, the prism sheet as the light-condensing sheet may be disposed as a laminate of two or more layers. In this case, it is preferable from the point of view of improvement of viewing characteristic or the like that the two or more layers are arranged so that the ridgelines of prisms in the upper and lower layers cross each other.

EXAMPLES

Example 1

An optically rotating film having an angle of rotation of 45 degrees was bonded onto a quarter-wave plate of a luminance-improving film (PCF350 made by Nitto Electric Industrial Co., Ltd.) through an acrylic tacky layer. The luminance-improving film was constituted by a laminate of a cholesteric liquid-crystal layer and a quarter-wave plate. An absorption type polarizer (SEG1425ADU made by Nitto Electric Industrial Co., Ltd.) was bonded onto the optically rotating film through an acrylic tacky layer so that the axis of polarization of the absorption type polarizer was inclined at 45 degrees with respect to the plane of polarization of linearly polarized light made to exit from the luminance-improving film. Thus, an optical member was obtained.

Incidentally, the optically rotating film was 6 μm thick and prepared as follows. A solution of a polymer constituted by a combination of an acrylic nematic liquid-crystal monomer and an acrylic chiral agent as an optically active monomer was developed on a rubbed film of polyvinyl alcohol provided on a glass plate. The polymer solution was dried at 160° C. for 2 minutes. The optically rotating film obtained thus was peeled off/collected from the rubbed film.

Example 2

A polarizing member was obtained in the same manner as that in Example 1 except that an optically rotating film having a thickness of 18 μm and having an angle of optical rotation of 135 degrees was used.

Comparative Example

A laminate was obtained in the same manner as that in Example 1 except that the optically rotating film was not disposed.

Evaluation Test

The polarizing member or laminate obtained in each of Examples 1 and 2 and Comparative Example was measured as to external appearance characteristic in a frontal direction, external appearance characteristic in an obliquely viewing direction and the quantity of the chromaticity change therebetween. On the condition that a polarizer was disposed on the light exit side of an illuminator so that the axial angle was adjusted to a value exhibiting the maximum luminance, the quantity of the chromaticity change was calculated by the following expression:

$$\text{Quantity of Chromaticity Change} = \sqrt{\{(X_0 - X_{50})^2 + (Y_0 - Y_{50})^2\}}$$

in which $(X_0, Y_0)$ were chromaticity coordinates in the frontal (perpendicular) direction, and $(X_{50}, Y_{50})$ were chromaticity coordinates in the obliquely viewing direction at an angle of 50 degrees.

Results of the measurement were shown in the following Table. Incidentally, oblique viewing was based on the direction at an angle of 50 degrees with respect to the axial direction of the absorption type polarizer.

|  | Frontal Direction | Obliquely Viewing Direction | Chromaticity Change | Total Evaluation |
| --- | --- | --- | --- | --- |
| Example 1 | White | White | 0.002 | Good |
| Example 2 | White | White | 0.001 | Good |
| Comparative Example | White | Blue | 0.014 | Bad |

It was apparent from the aforementioned results that coloring in the direction of the axis of polarization of the absorption type polarizer when oblique viewing was made was suppressed in Example 1 and 2 while such coloring occurred in Comparative Example.

INDUSTRIAL APPLICABILITY

According to the aforementioned polarizing member, the plane of polarization of light linearly polarized by a combination of the cholesteric liquid-crystal layer and the quarter-wave plate can be rotated by the optical rotatory layer. Hence, the angle of rotation is controlled so that the linearly polarized light can be supplied to the absorption type polarizer with good coincidence between the plane of polarization of the linearly polarized light and the axis of polarization of the absorption type polarizer. Hence, absorption loss can be prevented to thereby attain improvement of luminance. Further, good viewing characteristic can be achieved in the frontal direction. Moreover, the displacement of the optical axis owing to oblique viewing can be suppressed, so that coloring can be suppressed uniformly in all obliquely viewing azimuths. Hence, a liquid-crystal display device excellent in display quality can be obtained.

The invention claimed is:

1. A liquid crystal display device comprising:
 a liquid crystal cell, and
 a polarizing member disposed on a back side (opposite to a visual side) of said liquid crystal cell,
 wherein said polarizing member comprising:
  a cholesteric liquid-crystal layer,
  a quarter-wave plate,
  an optical rotatory film, wherein said quarter-wave plate is interposed between said cholesteric liquid-crystal layer and said optical rotatory film, said optical rotatory film being laminated on said quarter-wave plate through an adhesive layer and said optical rotatory film being a solid film; and
  an absorption type polarizer disposed on an upper side of said optical rotatory film, so that said optical rotatory film is interposed between said quarter-wave plate and said absorption type polarizer.

2. A liquid crystal display device according to claim 1, wherein a major or minor axis of said optical rotatory film in each of opposite surfaces of said optical rotatory film is parallel to a plane of polarization of light linearly polarized by a combination of said cholesteric liquid-crystal layer and said quarter-wave plate and to an axis of polarization of said absorption type polarizer.

3. A liquid crystal display device according to claim 1 or 2, wherein said optical rotatory film is made of a polymer containing a nematic liquid-crystal monomer and an optically active monomer as components.

4. A liquid crystal display device according to claim 1 or 2, wherein said optical rotatory film exhibits an angle of rotation satisfying an expression:

$$(2n+1)\pi/4$$

in which n is an integer.

5. A liquid crystal display device according to claim 3, wherein said optical rotatory film exhibits an angle of rotation satisfying an expression:

$$(2n+1)\pi/4$$

in which n is an integer.

* * * * *